US010692736B2

(12) United States Patent
Hashigami et al.

(10) Patent No.: US 10,692,736 B2
(45) Date of Patent: Jun. 23, 2020

(54) METHOD FOR PRODUCING HIGH-PHOTOELECTRIC-CONVERSION-EFFICIENCY SOLAR CELL AND HIGH-PHOTOELECTRIC-CONVERSION-EFFICIENCY SOLAR CELL

(71) Applicant: SHIN-ETSU CHEMICAL CO., LTD., Tokyo (JP)

(72) Inventors: Hiroshi Hashigami, Annaka (JP); Takenori Watabe, Annaka (JP); Hiroyuki Ohtsuka, Karuizawa-machi (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/755,968

(22) PCT Filed: Nov. 14, 2016

(86) PCT No.: PCT/JP2016/004875
§ 371 (c)(1),
(2) Date: Feb. 27, 2018

(87) PCT Pub. No.: WO2018/087794
PCT Pub. Date: May 17, 2018

(65) Prior Publication Data
US 2018/0342402 A1 Nov. 29, 2018

(51) Int. Cl.
H01L 21/324 (2006.01)
H01L 21/67 (2006.01)
(Continued)

(52) U.S. Cl.
CPC .......... *H01L 21/324* (2013.01); *C30B 35/007* (2013.01); *H01L 21/67248* (2013.01);
(Continued)

(58) Field of Classification Search
CPC ... H01L 21/324–3242; H01L 21/67248; H01L 31/02; H01L 31/18–1804;
(Continued)

(56) References Cited

U.S. PATENT DOCUMENTS 5,593,494 A * 1/1997 Falster .................... C30B 29/06
117/2
6,180,497 B1 1/2001 Sato et al.
(Continued)

FOREIGN PATENT DOCUMENTS

JP H08-162446 A 6/1996
JP 2000-100680 A 4/2000
(Continued)

OTHER PUBLICATIONS

Jun. 13, 2017 Office Action issued in Japanese Patent Application No. 2017-519702.
(Continued)

Primary Examiner — Zandra V Smith
Assistant Examiner — Jeremy J Joy
(74) Attorney, Agent, or Firm — Oliff PLC

(57) ABSTRACT

A method for producing a solar cell, which produces a single-crystal silicon solar cell by using a single-crystal silicon substrate, including: a high-temperature heat treatment process in which the single-crystal silicon substrate is subjected to heat treatment at 800° C. or higher and 1200° C. or lower, wherein the high-temperature heat treatment process includes a conveying step of loading the single-crystal silicon substrate into a heat treatment apparatus, a heating step of heating the single-crystal silicon substrate, a temperature keeping step of keeping the single-crystal silicon substrate at a predetermined temperature of 800° C. or higher and 1200° C. or lower, and a cooling step of cooling the single-crystal silicon substrate, and, in the high-tempera-
(Continued)

ture heat treatment process, the length of time during which the temperature of the single-crystal silicon substrate is 400° C. or higher and 650° C. or lower is set at 5 minutes or less throughout the conveying step and the heating step.

17 Claims, 3 Drawing Sheets

(51) Int. Cl.
*H01L 31/18* (2006.01)
*H01L 31/068* (2012.01)
*H01L 31/02* (2006.01)
*C30B 35/00* (2006.01)

(52) U.S. Cl.
CPC ............ *H01L 31/02* (2013.01); *H01L 31/068* (2013.01); *H01L 31/18* (2013.01); *Y02E 10/50* (2013.01); *Y02P 70/521* (2015.11)

(58) Field of Classification Search
CPC ......... H01L 31/068–0684; Y02E 10/50; Y02P 70/521; C30B 35/007
See application file for complete search history.

(56) References Cited

U.S. PATENT DOCUMENTS

| | | | | |
|---|---|---|---|---|
| 6,306,764 | B1* | 10/2001 | Kato | H01L 21/67109 438/660 |
| 6,336,968 | B1 | 1/2002 | Falster | |
| 6,544,656 | B1 | 4/2003 | Abe et al. | |
| 2002/0000185 | A1* | 1/2002 | Falster | C30B 15/206 117/2 |
| 2002/0189528 | A1 | 12/2002 | Falster | |
| 2003/0106481 | A1* | 6/2003 | Kononchuk | C30B 15/203 117/13 |
| 2003/0177976 | A1* | 9/2003 | Oki | H01L 31/028 117/20 |
| 2005/0092349 | A1* | 5/2005 | Suzuki | H01L 21/02032 134/2 |
| 2007/0261731 | A1* | 11/2007 | Abe | H01L 31/035281 136/244 |
| 2011/0278702 | A1* | 11/2011 | Horzel | H01L 21/2253 257/655 |
| 2012/0048369 | A1* | 3/2012 | Kobamoto | H01L 31/022433 136/256 |
| 2012/0260989 | A1* | 10/2012 | DeLuca | H01L 31/068 136/261 |
| 2013/0078822 | A1* | 3/2013 | Yokouchi | H01L 21/67115 438/795 |
| 2015/0069611 | A1* | 3/2015 | Martin | H01L 31/1804 257/751 |
| 2015/0132931 | A1* | 5/2015 | Kapur | H01L 31/1868 438/558 |
| 2016/0215413 | A1* | 7/2016 | Scala | C30B 15/04 |
| 2017/0301805 | A1* | 10/2017 | Yamarin | H01L 31/0224 |

FOREIGN PATENT DOCUMENTS

| | | |
|---|---|---|
| JP | 2002-151560 A | 5/2002 |
| JP | 2003-510800 A | 3/2003 |
| JP | 2003-524874 A | 8/2003 |
| JP | 2009-523694 A | 6/2009 |
| JP | 2013-118223 A | 6/2013 |
| JP | 2016-046400 A | 4/2016 |
| JP | 2016-093804 A | 5/2016 |
| TW | 2010-29056 A | 8/2010 |
| TW | 2013-14777 A | 4/2013 |
| TW | 201432101 A | 8/2014 |
| TW | 2016-30203 A | 8/2016 |
| WO | 00/55397 A1 | 9/2000 |

OTHER PUBLICATIONS

Aug. 15, 2017 Office Action issued in Japanese Patent Application No. 2017-519702.
Oct. 31, 2017 Office Action issued in Japanese Patent Application No. 2017-519702.
Dec. 13, 2016 International Search Report issued in Patent Application No. PCT/JP2016/004875.
Jun. 29, 2018 Search Report issued in Tawainese Patent Application No. 106108358.
Dec. 17, 2018 Extended Search Report issued in European Patent Application No. 16886814.9.
May 23, 2019 International Preliminary Report on Patentability issued in International Application No. PCT/JP2016/004875.
Nov. 25, 2019 Office Action issued in Taiwanese Patent Application No. 108100193.
Mar. 6, 2020 Office Action issued in European Patent Application No. 16886814.9.

* cited by examiner (a) (b)

(a) (b)

METHOD FOR PRODUCING HIGH-PHOTOELECTRIC-CONVERSION-EFFICIENCY SOLAR CELL AND HIGH-PHOTOELECTRIC-CONVERSION-EFFICIENCY SOLAR CELL

TECHNICAL FIELD

The present invention relates to a method for producing a high-photoelectric-conversion-efficiency solar cell and to a high-photoelectric-conversion-efficiency solar cell.

BACKGROUND ART

FIG. 2 schematically depicts a bifacial solar cell, which is one form of conventional solar cells. Moreover, FIG. 3 schematically depicts a mono-facial solar cell, which is another form of the conventional solar cell. In solar cells 100 and 200 depicted in FIGS. 2 and 3, emitter layers 102 and 202 are formed on substrates 101 and 201, respectively. The emitter layers 102 and 202 are formed by thermal diffusion of phosphorus or boron in accordance with the conductivity type of the substrate. Furthermore, back surface field (BSF) layers 103 and 203 are formed by phosphorus diffusion in the case of an n-type substrate and by boron diffusion or alloying of silicon and aluminum in the case of a p-type substrate. In addition, on the emitter layers 102 and 202, passivation layers 104 and 204 are respectively formed, and, also on the back surface field layer 103, the passivation layer 104 is formed. Moreover, the solar cell 100 includes an electrode 105 in contact with the emitter layer 102 and an electrode 106 in contact with the BSF layer 103 on a main surface opposite to a main surface on which the emitter layer 102 is located. On the other hand, the solar cell 200 includes an electrode 205 in contact with the emitter layer 202 and an electrode 206 in contact with the BSF layer 203 on a main surface (a main surface on which the back surface field layer 203 is formed) opposite to a main surface on which the emitter layer 202 is located.

Thermal diffusion of phosphorus is performed by heat treatment at 800° C. to 950° C. using a vapor phase diffusion source such as phosphorus oxychloride or a phosphoric acid-based application-type diffusion source. Moreover, thermal diffusion of boron is performed by heat treatment at 950° C. to 1200° C. using a vapor phase diffusion source such as boron bromide or a boric acid-based application-type diffusion source.

Furthermore, though not depicted in the drawings, when, for example, the diffusion performed on only one surface of the substrate is desired, a thermal oxide film having a film thickness of about 50 nm to 400 nm is sometimes formed on a surface to be prevented from being subjected to the diffusion. In this case, heat treatment at 800° C. to 1100° C. is performed in an atmosphere of oxygen or water vapor.

Moreover, for the substrates 101 and 201, single crystal silicon (CZ-Si) which is obtained by the Czochralski (CZ) process is generally used.

However, when CZ-Si is subjected to the heat treatment, the minority carrier lifetime is often reduced, resulting in low characteristics of the solar cell, which has been a problem. Defects that cause the above low characteristics, which are generally called swirls, are considered to be related to a silicon solid-liquid interface shape on the crystal growth, the concentration of impurities such as oxygen or carbon, and the density of crystal defects such as vacancies because the swirls are concentrically distributed from the central area of the substrate and considered to be generated mainly by oxygen precipitation in a heat treatment process in a subsequent solar cell production process. Thus, in the past, generation of defects has been generally avoided by setting an upper limit on the initial oxygen concentration of a substrate that is used.

On the other hand, for example, Patent Document 1 discloses a method in which a silicon substrate is subjected to heat treatment in an oxygen atmosphere at 1150° C. or higher and then cooling quickly to 950° C. at a rate between 20° C./sec and 5° C./sec, in order to eliminate oxygen precipitation.

CITATION LIST

Patent Literature

Patent Document 1: U.S. Pat. No. 6,336,968

SUMMARY OF INVENTION

Technical Problem

However, the problem is that setting the upper limit on the initial oxygen concentration of the substrate causes a decrease in the rate of utilization of a crystal silicon ingot, or requires use of crystal silicon by the MCZ process (the magnetic-field applied Czochralski process), which increases the cost of the substrate.

Moreover, the problem of such heat treatment as that described in Patent Document 1 is the difficulty of applying the heat treatment to a solar cell production process. In particular, in the case of a solar cell, there also arises the following technical problem: since batch processing with a large number of substrates is generally performed to increase productivity, quick cooling cannot be performed because of heat capacity.

The present invention has been made in view of the problems, and an object thereof is to provide a method for producing a solar cell, the method that can stably produce a solar cell whose photoelectric conversion efficiency is high and whose characteristics are uniform in a substrate plane by preventing a decrease in the minority carrier lifetime of a substrate in high-temperature heat treatment in a solar cell production process. Moreover, an object of the present invention is to provide a solar cell whose photoelectric conversion efficiency is high and whose characteristics are uniform in a substrate plane.

Solution to Problem

To attain the object, the present invention provides a method for producing a solar cell, which produces a single-crystal silicon solar cell by using a single-crystal silicon substrate, the method comprising:
  a high-temperature heat treatment process in which the single-crystal silicon substrate is subjected to heat treatment at 800° C. or higher and 1200° C. or lower, wherein
    the high-temperature heat treatment process includes
    a conveying step of loading the single-crystal silicon substrate into a heat treatment apparatus,
    a heating step of heating the single-crystal silicon substrate,
    a temperature keeping step of keeping the single-crystal silicon substrate at a predetermined temperature of 800° C. or higher and 1200° C. or lower, and
    a cooling step of cooling the single-crystal silicon substrate, and in the high-temperature heat treatment process, a length of time during which a temperature of the single-crystal silicon substrate is 400° C. or higher and 650° C. or lower is set at 5 minutes or less throughout the conveying step and the heating step.

By setting the length of time during which the temperature of the single-crystal silicon substrate is 400° C. or higher and 650° C. or lower at 5 minutes or less throughout the conveying step and the heating step, it is possible to annihilate various defects by minimizing the thermal history in a temperature zone of 400° C. or higher and 650° C. or lower in which precursors of oxygen precipitates or the like are formed, and the growth of the defects is prevented in the subsequent temperature keeping step and cooling step under various conditions. This makes it possible to maintain the minority carrier lifetime of the single-crystal silicon substrate long and thereby stably produce a solar cell whose photoelectric conversion efficiency is high and whose characteristics are uniform in a substrate plane.

At this time, it is preferable that, in a first high-temperature heat treatment process of the high-temperature heat treatment processes in a production of the solar cell from the single-crystal silicon substrate, the length of time during which the temperature of the single-crystal silicon substrate is 400° C. or higher and 650° C. or lower is set at 5 minutes or less.

By setting, in a first high-temperature heat treatment process, the length of time during which the temperature of the single-crystal silicon substrate is 400° C. or higher and 650° C. or lower at 5 minutes or less, it is possible to produce a solar cell having higher photoelectric conversion efficiency and more uniform characteristics in a substrate plane.

Additionally, it is preferable that the high-temperature heat treatment process is performed in an atmosphere containing an inert gas.

By performing the high-temperature heat treatment process in an atmosphere containing an inert gas, it is possible to perform impurity diffusion into the single-crystal silicon substrate reliably and easily.

Additionally, it is preferable that the inert gas is nitrogen or argon.

By using nitrogen or argon as the inert gas, it is possible to perform impurity diffusion into the single-crystal silicon substrate more reliably and easily.

Alternatively, it is preferable that the high-temperature heat treatment process is performed in an atmosphere containing oxygen or water.

By performing the high-temperature heat treatment process in an atmosphere containing oxygen or water, it is possible to form a silicon oxide film that can be used as, for example, a diffusion barrier layer reliably and easily.

Additionally, it is preferable that, in the conveying step, the single-crystal silicon substrate is placed in a hot zone of the heat treatment apparatus in 10 minutes or less.

By placing the single-crystal silicon substrate in a hot zone in 10 minutes or less, it is possible to set more reliably the length of time during which the temperature of the single-crystal silicon substrate is 400° C. or higher and 650° C. or lower at 5 minutes or less.

Additionally, it is preferable that the single-crystal silicon substrate is a CZ single-crystal silicon substrate.

In the CZ single-crystal silicon substrate, since the minority carrier lifetime is easily reduced, the effect of the present invention is particularly large. In addition, since the CZ single-crystal silicon substrate is inexpensive, it is possible to produce an inexpensive solar cell.

Additionally, the single-crystal silicon substrate that is used in production of the solar cell may be a single-crystal silicon substrate whose initial interstitial oxygen concentration is 12 ppma (JEIDA) or more.

Even with the single-crystal silicon substrate whose initial interstitial oxygen concentration is 12 ppma (JEIDA) or more, since oxygen precipitation can be prevented more effectively by applying the present invention, the effect of the present invention is particularly large.

Additionally, it is preferable that the amount of oxygen precipitates contained in the single-crystal silicon substrate after production of the solar cell is set at 2 ppma (JEIDA) or less.

By setting the amount of oxygen precipitates at 2 ppma (JEIDA) or less, it is possible to prevent more reliably a reduction in the minority carrier lifetime of the single-crystal silicon substrate.

Furthermore, the present invention provides a solar cell produced by the above method for producing a solar cell, wherein the solar cell has no swirls in electroluminescence or photoluminescence of the single-crystal silicon substrate in the single-crystal silicon solar cell.

Such a solar cell has high photoelectric conversion efficiency and uniform characteristics in a substrate plane.

Furthermore, to attain the object, the present invention provides a single-crystal silicon solar cell comprising a single-crystal silicon substrate, wherein an amount of oxygen precipitates contained in the single-crystal silicon substrate is 2 ppma (JEIDA) or less, and the solar cell has no swirls in electroluminescence or photoluminescence of the single-crystal silicon substrate in the single-crystal silicon solar cell.

This solar cell, in which the amount of oxygen precipitates is 2 ppma (JEIDA) or less and no swirls are present, has high photoelectric conversion efficiency and uniform characteristics in a substrate plane.

In this solar cell, it is preferable that the residual interstitial oxygen concentration contained in the single-crystal silicon substrate is 10 ppma (JEIDA) or more.

If the residual interstitial oxygen concentration in the single-crystal silicon substrate of the solar cell is 10 ppma (JEIDA) or more, the solar cell has fewer oxygen precipitates, higher photoelectric conversion efficiency, and more uniform characteristics in a substrate plane.

Additionally, it is preferable that the single-crystal silicon substrate is a CZ single-crystal silicon substrate.

If the single-crystal silicon substrate is a CZ single-crystal silicon substrate, the minority carrier lifetime is easily reduced, which makes it possible to provide a solar cell on which the present invention has a particularly large effect. In addition, since the CZ single-crystal silicon substrate is inexpensive, it is possible to provide an inexpensive solar cell.

Furthermore, the present invention provides a photovoltaic module comprising the above solar cells electrically connected to each other.

It is possible to provide a photovoltaic module by electrically connecting the solar cells of the present invention.

Furthermore, the present invention provides a photovoltaic power generation system comprising a plurality of the above photovoltaic modules electrically connected to each other.

It is possible to provide a photovoltaic power generation system by electrically connecting a plurality of photovoltaic modules, each being formed of the electrically connected solar cells of the present invention.

Advantageous Effects of Invention

According to the method for producing a solar cell of the present invention, even with a single-crystal silicon substrate whose interstitial oxygen concentration or concentration of other light element impurities is high, it is possible to produce stably a solar cell that maintains a long carrier life and has high photoelectric conversion efficiency. Moreover, the solar cell of the present invention has high photoelectric conversion efficiency and uniform characteristics in a substrate plane.

DESCRIPTION OF EMBODIMENTS

As described earlier, in recent years, generation of low-characteristic regions which are concentrically distributed from the central area of a substrate has become a problem in a solar cell. The inventors have found out that, in heat treatment at 800° C. or higher and 1200° C. or lower which is performed on a single-crystal silicon substrate, a condition under which the temperature is raised greatly influences the generation of defects which cause the problems and conducted an intensive study of measures to improve the characteristics of such regions, thereby bringing the present invention to completion.

Hereinafter, the present invention will be explained in detail with reference to the drawings, but the present invention is not limited thereto.

First, a method for producing a solar cell of the present invention will be explained. The method for producing a solar cell of the present invention is a method for producing a solar cell, which produces a single-crystal silicon solar cell by using a single-crystal silicon substrate, including a high-temperature heat treatment process in which the single-crystal silicon substrate is subjected to heat treatment at 800° C. or higher and 1200° C. or lower, wherein the high-temperature heat treatment process includes a conveying step of loading the single-crystal silicon substrate into a heat treatment apparatus, a heating step of heating the single-crystal silicon substrate, a temperature keeping step of keeping the single-crystal silicon substrate at a predetermined temperature of 800° C. or higher and 1200° C. or lower, and a cooling step of cooling the single-crystal silicon substrate, and in the high-temperature heat treatment process, a length of time during which a temperature of the single-crystal silicon substrate is 400° C. or higher and 650° C. or lower is set at 5 minutes or less throughout the conveying step and the heating step.

By setting the length of time during which the temperature of the single-crystal silicon substrate is 400° C. or higher and 650° C. or lower at 5 minutes or less throughout the conveying step and the heating step, it is possible to annihilate various defects by minimizing the thermal history in a temperature zone of 400° C. or higher and 650° C. or lower in which precursors of oxygen precipitates or the like are formed, and the growth of the defects is prevented in the subsequent temperature keeping step and cooling step under various conditions. This makes it possible to maintain the minority carrier lifetime of the single-crystal silicon substrate long and thereby stably produce a solar cell whose photoelectric conversion efficiency is high and whose characteristics are uniform in a substrate plane.

Figure 2:
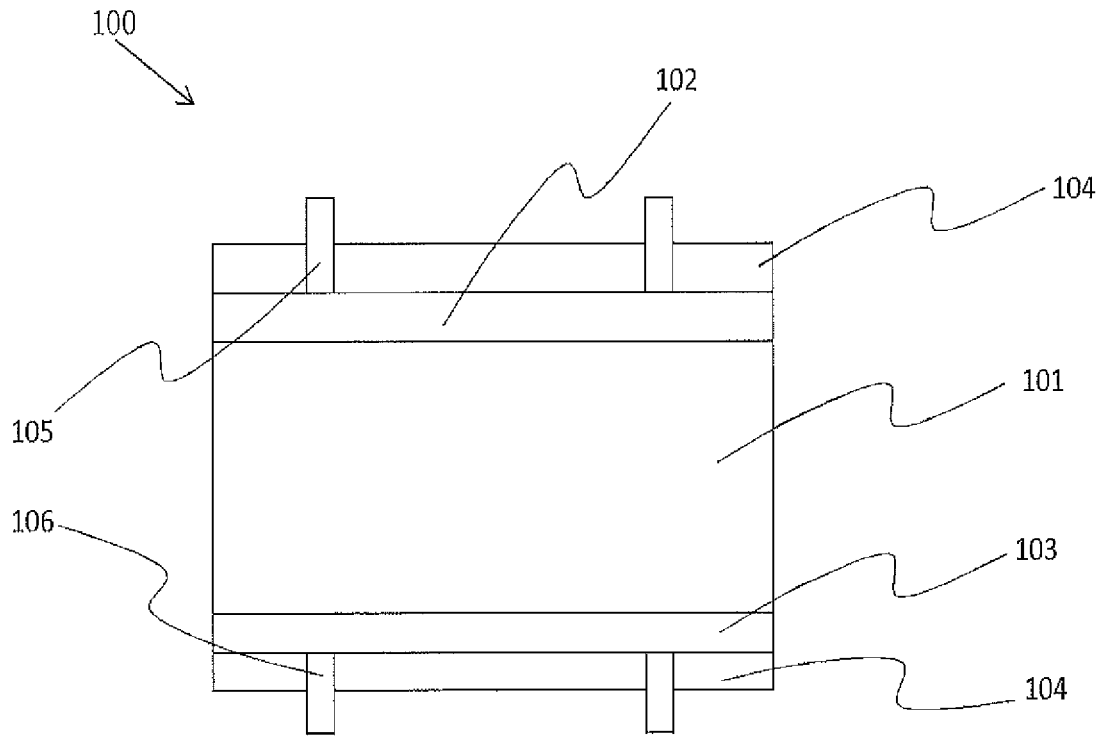
FIG. 2 is a cross-sectional schematic diagram depicting the structure of a common bifacial solar cell to which the present invention can be applied.
Figure 3:
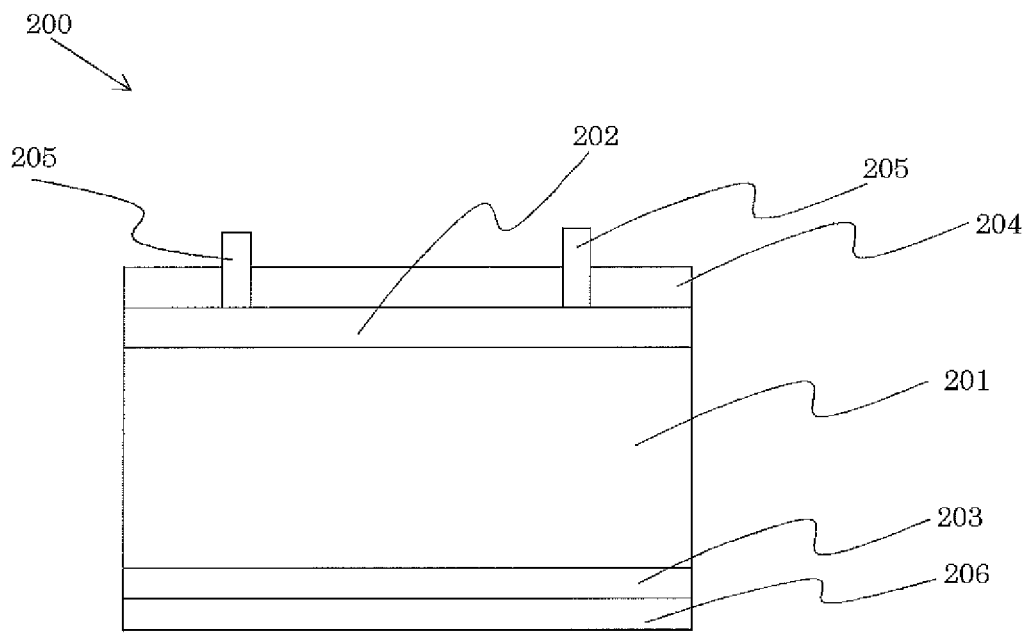
FIG. 3 is a cross-sectional schematic diagram depicting the structure of a common mono-facial solar cell to which the present invention can be applied.

Hereinafter, the method for producing a solar cell of the present invention will be explained in accordance with the production steps with reference to FIGS. 1, 2, and 3.

The single-crystal silicon substrate (101 of FIG. 2, 201 of FIG. 3) used in the present invention may be a CZ single-crystal silicon substrate fabricated by a common CZ process. In general, as the single-crystal silicon substrate, p-type silicon obtained by doping single crystal silicon with a group-III element such as B or Ga or n-type silicon obtained by doping single crystal silicon with a group-V element such as phosphorus or antimony can be used. No particular restriction is imposed on the resistivity of the substrate, and a common substrate having a resistivity of about 0.1 to 10 Ω·cm may be used. Although CZ silicon usually has an initial interstitial oxygen concentration of 10 to 20 ppma (JEIDA), a substrate having any concentration can be used in the present invention without problems.

The higher the initial interstitial oxygen concentration, the more easily oxygen precipitates are formed; on the other hand, it is known that, if the concentration of impurities such as carbon or nitrogen is high, these impurities become precipitate nuclei and oxygen precipitates are formed even in an initial interstitial oxygen concentration of about 12 ppma. However, in the present invention, since the growth of precipitate nuclei itself is avoided, even the substrate having high impurity concentration also can be used without problems.

Moreover, on the substrate surface, texture for suppressing reflection of incident light may be formed. The texture can be easily formed by immersing the substrate in an alkaline solution (concentration: 1 to 10%, temperature: 60 to 100° C.) such as heated sodium hydroxide, potassium hydroxide, potassium carbonate, sodium carbonate, sodium hydrogen carbonate, or tetramethylammonium hydroxide for about 10 to 30 minutes. Since the alkali metal sometimes adheres to the substrate surface after the formation of the texture, it is preferable to clean the substrate surface subsequently in, for example, an acid aqueous solution of hydrochloric acid, sulfuric acid, nitric acid, hydrofluoric acid, or a mixed solution thereof.

Main high-temperature heat treatment processes in the course of production of a solar cell are phosphorus diffusion and boron diffusion, and also include, in some cases, thermal oxidation and, in some rare cases, the formation of an epitaxial layer of high concentration silicon to which phosphorus or boron was added in high concentration.

Moreover, due to the need to increase productivity, in general, many substrates are often treated in one batch by using a horizontal or vertical quartz tube electric furnace. In this method, about 100 to 200 substrates are loaded on a quartz slave (small) board for holding the substrates, 4 to 8 small boards, each being loaded with substrates, are mounted on a large board also made of quartz, and this large board is put in a hot zone of a furnace kept at a predetermined temperature.

Figure 1:
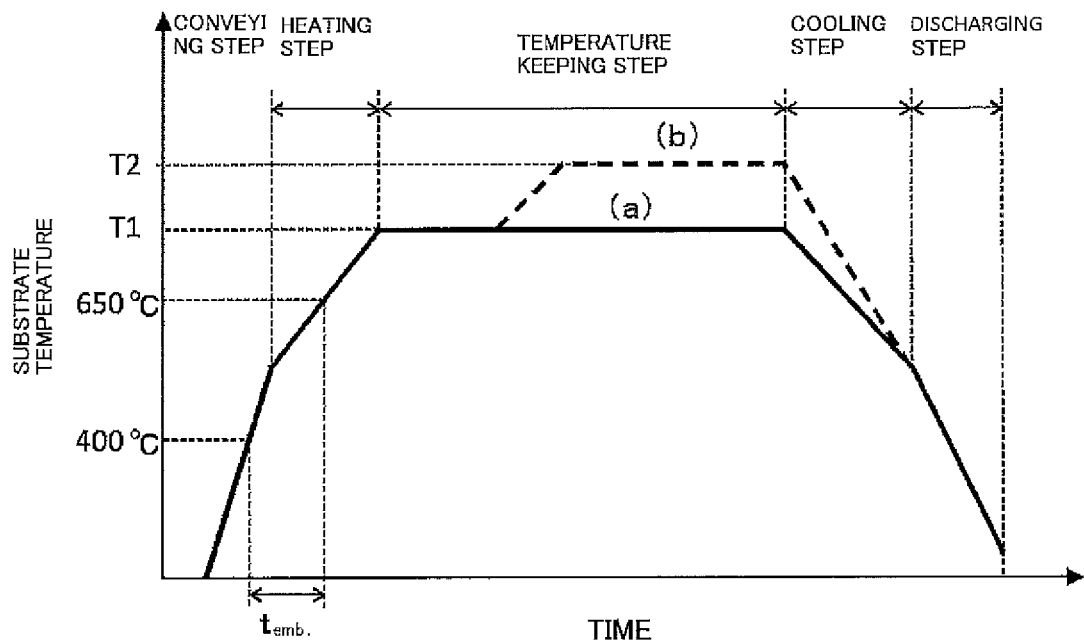
FIG. 1 is a schematic diagram of a temperature profile depicting an example of a high-temperature heat treatment process according to the present invention.

FIG. 1 conceptually depicts the temperature profile of the high-temperature heat treatment process. In the present invention, from the conveying step to the heating step, the length of time $t_{emb.}$ during which the temperature of the substrate is 400° C. or higher and 650° C. or lower is set at 5 minutes or less, preferably 3 minutes or less, and heating is then performed until T1 at which high-temperature heat treatment is performed. As a result, it is possible to annihilate defects such as oxygen precipitate nuclei formed during the crystal growth and thereby avoid the subsequent formation of crystal defects such as oxygen precipitate nuclei.

In order to satisfy the condition that sets the length of time during which the temperature of the substrate is 400° C. or higher and 650° C. or lower at 5 minutes or less, in the conveying step, although depending on the number of loaded substrates or the characteristics of the furnace, it is preferable to place the substrate in a hot zone of a heat treatment apparatus in 10 minutes or less, more preferably 5 minutes or less. Placement performed in 10 minutes or less makes it easy to set $t_{emb.}$ at 5 minutes or less, thereby preventing the formation of oxygen precipitate precursors in the substrate.

Moreover, in the course of the substrate reaching the hot zone, the temperature of the furnace decreases in accordance with, for example, the heat capacity of the substrate or the board. A step in which heating is performed after the completion of conveyance until the substrate temperature reaches a set temperature (T1) is the heating step. Also in this step, the output of a heater may be increased if necessary to increase the substrate temperature quickly and shorten $t_{emb.}$ as much as possible. Furthermore, control may be performed in such a way that the furnace temperature is set at a temperature slightly higher than T1 in expectation of the amount of decrease in temperature so as to be T1 near the completion of the heating step.

For the formation of an emitter layer (102, 202) when an n-type substrate is used, boron diffusion is usually performed; in this case, T1 is preferably 950 to 1200° C. As a boron diffusion source, common boron bromide may be used. In common boron bromide diffusion, when the substrate is heated to a set temperature, the substrate temperature is then kept constant at the set temperature (the start of the temperature keeping step). When the temperature is stabilized, boron bromide is bubbled by an inert gas such as nitrogen or argon, and mixed with an inert gas of a different type as a carrier gas to introduce the mixed gas into the furnace. At this time, a small amount of oxygen may be mixed in order to accelerate the formation of a boron glass layer on the substrate.

After a lapse of a predetermined time, bubbling is stopped, and heat treatment may be further performed for about 10 to 60 minutes in order to diffuse boron continuously into the substrate from the boron glass adhering to the substrate in an atmosphere containing an inert gas.

In this way, the high-temperature heat treatment process can be performed in the atmosphere containing an inert gas. By performing the high-temperature heat treatment process in the atmosphere containing an inert gas, it is possible to perform impurity diffusion into the substrate reliably and easily.

Moreover, it is preferable that the inert gas is nitrogen or argon. By using nitrogen or argon as the inert gas, it is possible to perform impurity diffusion into the substrate more reliably and easily.

The temperature condition in the temperature keeping step is not limited to a particular temperature condition. For instance, the substrate may be treated with the temperature kept constant at T1 as indicated by a solid line of (a) of FIG. 1 or treatment may be performed at a higher temperature T2 from a certain point in time as indicated by a dashed line of (b) of FIG. 1.

After the completion of boron diffusion, the procedure proceeds to a cooling step to cool the substrate to a predetermined temperature. No restriction is imposed on the cooling rate; however, if the substrate is suddenly cooled from the temperature zone to the room temperature, the substrate sometimes cracks by thermal shock. Therefore, it is desirable to cool the substrate from 700° C. to 500° C. and then discharge the substrate from the furnace (discharging step).

The above description has been given by taking up, as an example, boron diffusion using boron bromide. As another example of the diffusion source, a mixture of a boron compound and a binder may be applied to the substrate in advance, and then similar heat treatment may be performed. Alternatively, good results can also be obtained by heat treatment for diffusing boron from boron glass formed by a chemical vapor deposition method using borohydride, silicon hydride, oxygen, and so forth as raw materials. Moreover, when doping is performed by ion implantation, applying the same temperature condition as in the above embodiment employing thermal diffusion to dopant activation heat treatment yields results that are equal to those of the case of the thermal diffusion.

On the other hand, when a p-type substrate is used, phosphorus diffusion is generally adopted in junction formation, and phosphorus oxychloride is mainly used as the diffusion source. Phosphorus diffusion can be performed in a manner roughly similar to boron diffusion. However, since phosphorus has a large diffusion coefficient compared to boron, T1 is generally set at about 800° C. or higher and 950° C. or lower. Moreover, in addition to phosphorus oxychloride, phosphoric acid or a phosphorus compound such as Phosmer may be used as the diffusion source. Alternatively, heat treatment for diffusing phosphorus from phosphorus glass formed by a chemical vapor deposition method using phosphorus hydride, silicon hydride, oxygen, and so forth as raw materials also yields good results.

To fabricate a bifacial solar cell, it is necessary to perform both boron diffusion and phosphorus diffusion which have been described above. In this case, one of them may be performed before the other or, after the diffusion source applied film or boron glass and phosphorus glass by chemical vapor deposition are respectively formed on a light-receiving surface and a back surface opposite thereto of the substrate, heat treatment may be performed at the same time.

When, for example, there is a desire to prevent a surface opposite to a predetermined substrate surface from being auto-doped with a dopant, a silicon oxide film may be formed on one surface of the substrate by thermal oxidation in advance as a diffusion barrier layer. In this case, it is preferable to perform the high-temperature heat treatment process in an oxygen atmosphere or an atmosphere containing water (for example, a water-vapor atmosphere) with T1 being set at 800° C. or higher and 1050° C. or lower. Also in this case, if a quartz tube furnace or the like is used, it is preferable to place the substrate in a hot zone of the furnace in 10 minutes or less, more preferably 5 minutes or less in the conveying step.

Moreover, in a first high-temperature heat treatment process in the course of production of a solar cell from a substrate, it is preferable to set the length of time during which the temperature of the substrate is 400° C. or higher and 650° C. or lower at 5 minutes or less. The method for producing a solar cell of the present invention can be applied to all high-temperature heat treatment processes in the course of production of a solar cell; in particular, by applying the method to the high-temperature heat treatment process which is performed first, it is possible to obtain a higher effect.

Next, a passivation film (104, 204) is formed. As the passivation film, a film having a refractive index of about 1.9 to 2.2, such as a silicon nitride film, titanium oxide, or tin oxide, can be formed on the substrate surface so as to have a thickness of about 100 nm. For example, since a silicon nitride film that is formed by a chemical vapor method and used as a single layer can provide both effects of passivation and antireflection, the silicon nitride film is widely used in common solar cells. On the other hand, when a thermal silicon oxide film, aluminum oxide, or the like is used as the passivation film (104, 204), the silicon nitride film may be stacked thereon.

Next, electrodes (105 and 106 of FIGS. 2 and 205 and 206 of FIG. 3) are formed on the light-receiving surface and the back surface of the substrate. The electrodes (105, 106, 205, 206) can be formed by printing, on the light-receiving surface and the back surface, conductive paste such as silver paste obtained by mixing silver powder and glass frit with an organic binder and sintering the conductive paste at a temperature of 500 to 900° C. for 1 to 20 seconds. As a result of this heat treatment, the passivation film (104, 204) is eroded by the conductive paste, and the electrodes (105, 106, 205, 206) which are sintered bodies of this conductive paste make electrical contact with silicon by penetrating (fire-through) the passivation film and the like. Incidentally, sintering of the light-receiving surface and back surface electrodes can be performed for each surface.

The presence or absence of defects caused by heat treatment in the solar cell thus fabricated can be checked by measuring the carrier life distribution of the solar cell substrate. The carrier life distribution can be measured by a photoconductive decay method, and it is preferable that the measuring apparatus thereof has a resolution of 8 mm or less to obtain a clear result.

Moreover, in this case, to obtain a measurement sample, it is necessary to bring the solar cell to a substrate state and then perform surface passivation again. For this reason, the electrodes and the passivation film formed on the solar cell are first removed by an acid solution, and then the diffusion layer is etched by nitrohydrofluoric acid or an alkaline solution such as a sodium hydroxide aqueous solution. Then, surface passivation is formed on both surfaces of the substrate. This surface passivation may be any surface passivation that can be formed at 300° C. or lower and provide a sufficient passivation effect. For example, a silicon nitride film or an aluminum oxide film obtained by CVD can be suitably used. Moreover, good results can also be obtained by immersing the substrate in a quinhydrone methanol solution of about 0.1 mol % for about 30 minutes.

As a simpler method for evaluating the carrier life distribution of the solar cell substrate, an electroluminescence (EL) method or a photoluminescence (PL) method can be used for the solar cell. These methods allow one to capture a phenomenon in which the luminescence efficiency of the infrared radiation generated when charge carriers are injected into silicon is reduced by energy levels such as heat-induced defects between the energy bands of the silicon.

In the case of EL, a current comparable to a short-circuit current of the solar cell is injected by applying a forward bias to the solar cell, and light with a wavelength of 900 to 1100 nm is detected.

In the case of PL, charge carriers are injected by light. Since an excitation light is required to have a sufficient penetration depth with respect to the substrate, it is preferable to use light with a wavelength of 700 to 900 nm. A detector similar to that used in the case of EL can be used, but, to avoid an inadvertent appearance of the excitation light, it is preferable to use a detector that has no sensitivity to the excitation light waveband.

One of the reasons to use the carrier lifetime for evaluation of defects as described above is that the amount of oxygen precipitates which are formed by heat treatment generally performed in the solar cell production process is very small, and the direct observation thereof is extremely difficult. However, since the initial interstitial oxygen concentration is reduced by precipitation, the amount of precipitates can be evaluated as an oxygen concentration difference $\Delta O_i$ between oxygen concentrations before and after the heat treatment. That is, the amount of precipitates can be determined by using the following relationship.

$$\text{(Initial interstitial oxygen concentration)} - \text{(Residual interstitial oxygen concentration)} = \text{Oxygen concentration difference } \Delta O_i = \text{Amount of oxygen precipitates} \quad (1)$$

In the method for producing a solar cell of the present invention, as the substrate that is used in the production of a solar cell, a substrate whose initial interstitial oxygen concentration is 12 ppma (JEIDA) or more can be adopted. As described above, even with a substrate whose initial interstitial oxygen concentration is 12 ppma (JEIDA) or more, since it is possible to prevent oxygen precipitation more effectively by applying the present invention, the effect of the present invention is particularly large.

Moreover, it is preferable to set the amount of oxygen precipitates contained in the substrate after the production of the solar cell measured by the above evaluation method at 2 ppma (JEIDA) or less. By setting the amount of oxygen precipitates at 2 ppma (JEIDA) or less, it is possible to suppress a reduction in the minority carrier lifetime of the substrate more reliably.

Moreover, the present invention provides a solar cell produced by the above method for producing a solar cell, in which the solar cell has no swirls in electroluminescence or photoluminescence of the single-crystal silicon substrate in the single-crystal silicon solar cell. Such a solar cell has high photoelectric conversion efficiency and uniform characteristics in a substrate plane.

Hereinafter, the solar cell of the present invention will be further described. The solar cell of the present invention is a single-crystal silicon solar cell provided with a single-crystal silicon substrate. The single-crystal silicon substrate contains oxygen precipitates in an amount of 2 ppma (JEIDA) or less, and the single-crystal silicon solar cell has no swirls in electroluminescence or photoluminescence of the single-crystal silicon substrate.

This solar cell, in which the amount of oxygen precipitates is 2 ppma (JEIDA) or less and no swirls are present, has high photoelectric conversion efficiency and uniform characteristics in a substrate plane.

Moreover, it is preferable that the residual interstitial oxygen concentration contained in the single-crystal silicon substrate is 10 ppma (JEIDA) or more. If the residual interstitial oxygen concentration in the single-crystal silicon substrate of the solar cell is 10 ppma (JEIDA) or more, the solar cell has fewer oxygen precipitates, higher photoelectric conversion efficiency, and more uniform characteristics in a substrate plane.

Furthermore, it is preferable that the single-crystal silicon substrate is a CZ single-crystal silicon substrate. If the single-crystal silicon substrate is a CZ single-crystal silicon substrate, the minority carrier lifetime is easily reduced, which makes it possible to provide a solar cell on which the present invention has a particularly large effect. In addition, since the CZ single-crystal silicon substrate is inexpensive, it is possible to provide an inexpensive solar cell.

Figure 4:
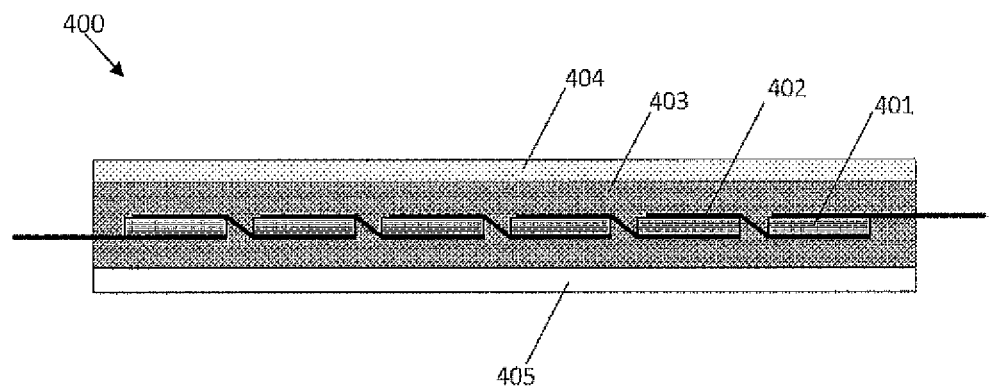
FIG. 4 is a cross-sectional schematic diagram depicting an example of a photovoltaic module according to the present invention.

Moreover, it is possible to obtain a photovoltaic module by electrically connecting the solar cells. A plurality of solar cells can be electrically connected in series. In FIG. 4, a cross-sectional view of an example of a photovoltaic module 400 of the present invention is depicted. Adjacent solar cells 401 are electrically connected by tabs 402. The connected solar cells 401 are sealed with a filler 403, a cover glass 404, and a back sheet 405. As the cover glass 404, soda-lime glass is widely used. Furthermore, as the filler 403, ethylene-vinyl acetate, polyolefin, silicone, or the like is used. As the back sheet 405, a functional film using polyethylene terephthalate is generally used.

Figure 5:
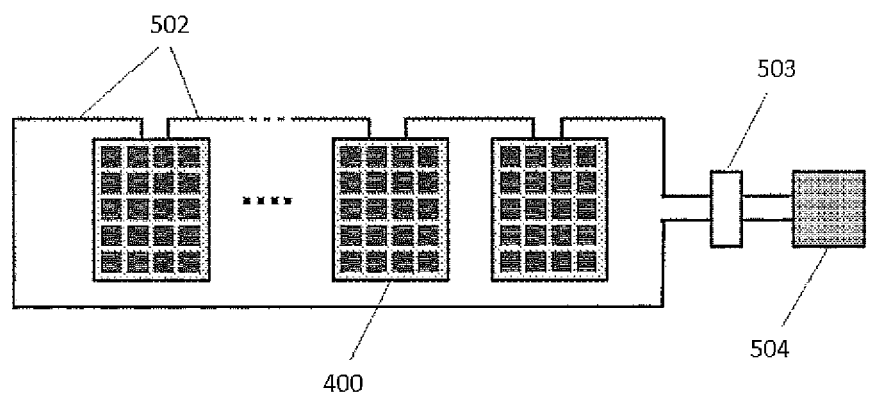
FIG. 5 is a schematic diagram depicting an example of a photovoltaic power generation system according to the present invention.

FIG. 5 is a schematic diagram depicting an example of a basic configuration of a photovoltaic power generation system in which photovoltaic modules of the present invention are coupled. A plurality of photovoltaic modules 400 are coupled by wiring 502 and supply generated electric power to an external load circuit 504 via an inverter 503. Though not depicted in this drawing, this system may further include a secondary battery that stores the generated electric power.

EXAMPLE

Hereinafter, the present invention will be explained more specifically with Examples and Comparative Examples, but the present invention is not limited to these examples.

Example 1

First, 100 phosphorus-doped n-type CZ silicon substrates with a resistivity of 1 Ω·cm and an initial interstitial oxygen concentration of 20 ppma were prepared, and texture was formed on the surfaces thereof.

These substrates were transferred to a quartz board and then conveyed to a hot zone of a quartz furnace kept at a temperature of 1100° C. at a rate of 2000 mm/min, and conveyance was completed in 1 minute and 20 seconds. Then, the output of a heater was adjusted, whereby the furnace temperature was kept at 1000° C. in about 2 minutes after the completion of conveyance. Then, boron bromide was bubbled by argon gas for 10 minutes and supplied to the inside of the furnace, whereby boron glass was formed on the substrate surfaces, and boron was then diffused for 30 minutes. Changes in the substrate temperature during this period were measured with a monitor substrate on which a thermocouple was installed, which revealed that the residence time ($t_{emb.}$) from 400 to 650° C. was 1 minute and 40 seconds.

Next, after surfaces opposite to the boron diffusion surfaces were etched with nitrohydrofluoric acid and cleaned, the substrates were loaded on the quartz board such that the boron-diffused surface of a substrate was superposed on the boron-diffused surface of another substrate and conveyed to the hot zone of the quartz furnace kept at a temperature of 950° C. at a rate of 2000 mm/min, and conveyance was completed in 1 minute and 20 seconds. Then, the output of the heater was adjusted, whereby the furnace temperature was kept at 900° C. in about 2 minutes after the completion of conveyance. Then, phosphorus oxychloride was bubbled for 5 minutes and supplied to the inside of the furnace, whereby phosphorus glass was formed on the substrate surfaces, and phosphorus was then diffused for 30 minutes. Changes in the substrate temperature during this period were measured with the monitor substrate on which the thermocouple was installed, which revealed that $t_{emb.}$ was 55 seconds.

From the substrates taken out of the quartz furnace, the boron glass and the phosphorus glass were removed with an aqueous hydrofluoric acid solution, and the substrates were cleaned with a mixed solution of hydrochloric acid water and hydrogen peroxide. Then, an aluminum oxide film having a thickness of 20 nm was formed on the light-receiving surfaces by using plasma CVD, and silicon nitride was then formed on both surfaces of the substrates so as to have a thickness of 100 nm. Next, silver paste was printed on the light-receiving surfaces and the back surfaces of the substrates by screen printing and, after being dried at 150° C. for about 30 seconds, the silver paste was sintered at 840° C. for 3 seconds, whereby electrodes were formed. In this way, solar cells were fabricated.

The characteristics of these solar cells were measured by using pseudo sunlight of a Xe lamp light source. The measurement results are shown in Table 1. Each numerical value shown in Table 1 is the average value of the 100 substrates. In Table 1, the measurement results of Comparative Example 1, which will be described later, are also shown.

TABLE 1

| | Short-circuit current [mA/cm$^2$] | Open-circuit voltage [mV] | Fill factor | Conversion efficiency [%] |
|---|---|---|---|---|
| Example 1 | 39.7 | 0.655 | 0.805 | 20.9 |
| Comparative Example 1 | 38.2 | 0.635 | 0.802 | 19.5 |

Comparative Example 1

100 substrates similar to those of Example 1 were prepared, and texture was formed on the surfaces thereof. These substrates were transferred to the quartz board and then conveyed to a hot zone of the quartz furnace kept at a temperature of 600° C. at a rate of 2000 mm/min, and conveyance was completed in 1 minute and 20 seconds. After the furnace temperature was stabilized at 600° C., the temperature was kept constant for 5 minutes and the furnace temperature was then raised to 1000° C. After the furnace temperature was stabilized at 1000° C., boron bromide was bubbled for 10 minutes and supplied to the inside of the furnace, whereby boron glass was formed on the substrate surfaces, and boron was then diffused for 30 minutes. Changes in the substrate temperature during this period were measured with the monitor substrate on which the thermocouple was installed, which revealed that $t_{emb.}$ was 9 minutes and 30 seconds.

The subsequent processes were performed in the same manner as in Example 1 except that $t_{emb.}$ at the time of diffusion of phosphorus was set at 6 minutes, whereby solar cells were fabricated. The characteristics of these solar cells were measured by using pseudo sunlight of the Xe lamp light source. The measurement results are shown in Table 1. Each numerical value shown in Table 1 is the average value of the 100 substrates.

As shown in Table 1, the characteristics of the solar cells of Example 1 were better than the characteristics of the solar cells of Comparative Example 1.

Moreover, one sample (solar cell) exhibiting an average value was extracted from each of Example 1 and Comparative Example 1, and a forward current of 9 A was injected into these solar cells by an EL imaging device (PVX100 manufactured by ITES Co., Ltd.) and an EL image of each cell was obtained with an exposure time of 8 seconds at ISO 800 and f/4.

Figure 6:
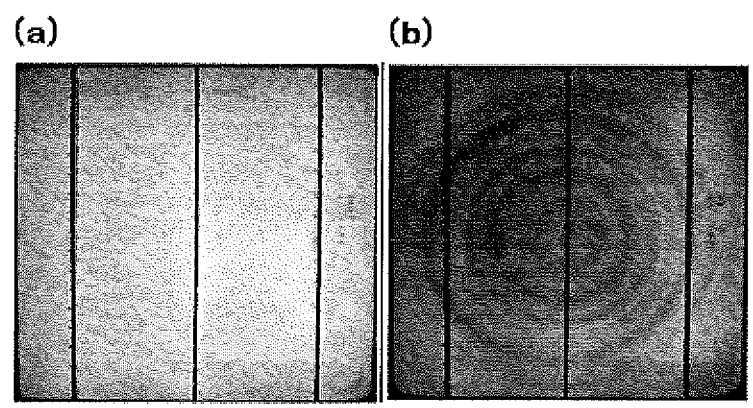
FIG. 6 are a diagram ((a)) depicting an EL image of a solar cell of Example 1 and a diagram ((b)) depicting an EL image of a solar cell of Comparative Example 1.

FIG. 6(a) is an EL image of the solar cell of Example 1, and FIG. 6(b) is an EL image of the solar cell of Comparative Example 1. In FIG. 6(a), uniform light emission in a plane of the solar cell was observed; however, in FIG. 6(b), swirls were formed and regions with low solar cell characteristics were observed as concentric, low-contrast portions.

Next, the entire surfaces of the solar cells depicted in FIGS. 6(a) and 6(b) were irradiated with light with a wavelength of 800 nm by a PL imaging device (POPLI manufactured by ITES Co., Ltd.), and a PL image of each cell was obtained at an exposure time of 30 seconds at ISO 1600 and f/1.8.

Figure 7:
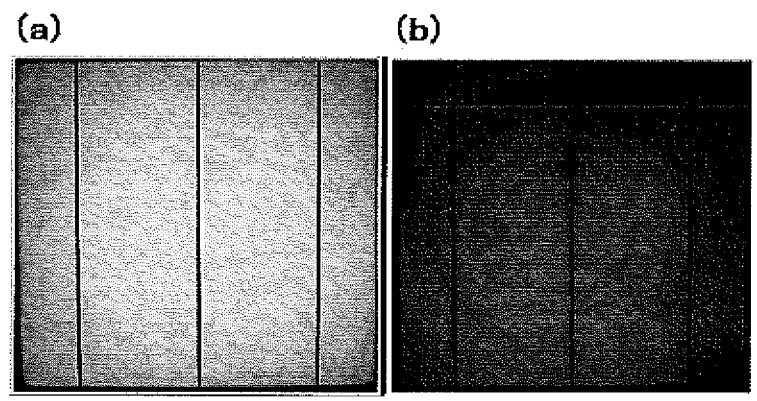
FIG. 7 are a diagram ((a)) depicting a PL image of the solar cell of Example 1 and a diagram ((b)) depicting a PL image of the solar cell of Comparative Example 1.

FIG. 7(a) is a PL image of the solar cell (Example 1) of FIG. 6(a), and FIG. 7(b) is a PL image of the solar cell (Comparative Example 1) of FIG. 6(b). Also in the PL method, as in the EL method, uniform light emission in a plane of the solar cell was observed in the solar cell of Example 1; however, swirls were observed in the solar cell of Comparative Example 1.

Example 2

100 boron-doped p-type CZ silicon substrates with a resistivity of 1 Ω·cm and an interstitial oxygen concentration of 20 ppma were prepared, and texture was formed on the surfaces thereof.

These substrates were transferred to the quartz board and then conveyed to a hot zone of the quartz furnace kept at a temperature of 900° C. at a rate of 2000 mm/min, and conveyance was completed in 1 minute and 20 seconds. Then, the output of the heater was adjusted, whereby the furnace temperature was kept at 900° C. in about 1 minute after the completion of conveyance. Then, phosphorus oxychloride was bubbled by argon gas for 10 minutes and supplied to the inside of the furnace, whereby phosphorus glass was formed on the substrate surfaces, and phosphorus was then diffused for 30 minutes. Changes in the substrate temperature during this period were measured with the monitor substrate on which the thermocouple was installed, which revealed that $t_{emb.}$ was about 30 seconds.

From the substrates taken out of the quartz furnace, the phosphorus glass was removed by an aqueous hydrofluoric acid solution, and the substrates were cleaned with a mixed solution of hydrochloric acid water and hydrogen peroxide. Then, a silicon nitride film having a thickness of 100 nm was formed on the light-receiving surfaces by using plasma CVD. Next, silver paste was printed on the light-receiving surfaces of the substrates and aluminum paste was printed on the back surfaces by screen printing, and, after being dried at 150° C. for about 30 minutes, the silver paste and the aluminum paste were sintered at 840° C. for 3 seconds, whereby electrodes were formed. In this way, solar cells were fabricated.

The characteristics of these solar cells were measured by using pseudo sunlight of the Xe lamp light source. The measurement results are shown in Table 2. Each numerical value shown in Table 2 is the average value of the 100 substrates. In Table 2, the measurement results of Comparative Example 2, which will be described later, are also shown.

TABLE 2

| | Short-circuit current [mA/cm$^2$] | Open-circuit voltage [mV] | Fill factor | Conversion efficiency [%] |
|---|---|---|---|---|
| Example 2 | 38.5 | 0.633 | 0.792 | 19.3 |
| Comparative Example 2 | 37.6 | 0.615 | 0.795 | 18.4 |

Comparative Example 2

100 substrates similar to those of Example 2 were prepared, and texture was formed on the surfaces thereof. These substrates were transferred to the quartz board and conveyed to a hot zone of the quartz furnace kept at a temperature of 900° C. at a rate of 300 mm/min, and conveyance was completed in 8 minutes and 50 seconds. Then, the output of the heater was adjusted, whereby the furnace temperature was kept at 900° C. in about 1 minute after the completion of conveyance. Then, phosphorus oxychloride was bubbled by argon gas for 10 minutes and supplied to the inside of the furnace, whereby phosphorus glass was then formed on the substrate surfaces, and phosphorus was then diffused for 30 minutes. Changes in the substrate temperature during this period were measured with the monitor substrate on which the thermocouple was installed, which revealed that $t_{emb.}$ was about 6 minutes and 20 seconds.

The subsequent processes were performed in the same manner as in Example 2, whereby solar cells were fabricated. The characteristics of these solar cells were measured by using pseudo sunlight of the Xe lamp light source. The measurement results are shown in Table 2. Each numerical value shown in Table 2 is the average value of the 100 substrates.

As shown in Table 2, the characteristics of the solar cells of Example 2 were better than the characteristics of the solar cells of Comparative Example 2.

Example 3

100 substrates similar to those of Example 1 were prepared, and texture was formed on the surfaces thereof. Next, these substrates were conveyed to a hot zone of the quartz furnace kept at 1000° C. in an oxygen atmosphere at a rate of 2000 mm/min, and conveyance was completed in 1 minute and 20 seconds. Then, the output of the heater was adjusted, whereby the furnace temperature was kept at 1000° C. for 180 minutes in about 2 minutes after the completion of conveyance, and a silicon oxide film having a thickness of about 100 nm was formed on the substrate surfaces. Changes in the substrate temperature during this period were measured with the monitor substrate on which the thermocouple was installed, which revealed that $t_{emb.}$ was 1 minute and 40 seconds.

Then, the oxide film on one surface of each substrate was removed by an aqueous hydrofluoric acid solution, and boron was diffused over the surface from which the oxide film was removed in the same manner as in Example 1. The subsequent processes were performed in the same manner as in Example 1, whereby solar cells were fabricated.

The characteristics of these solar cells were measured by using pseudo sunlight of the Xe lamp light source. The measurement results are shown in Table 3. Each numerical value shown in Table 3 is the average value of the 100 substrates. Incidentally, in Table 3, the measurement results of Comparative Example 3, which will be described later, are also shown.

TABLE 3

|  | Short-circuit current [mA/cm$^2$] | Open-circuit voltage [mV] | Fill factor | Conversion efficiency [%] |
|---|---|---|---|---|
| Example 3 | 39.5 | 0.650 | 0.802 | 20.6 |
| Comparative Example 3 | 38.1 | 0.623 | 0.802 | 19.0 |

Comparative Example 3

100 substrates similar to those of Example 1 were prepared, and texture was formed on the surfaces thereof. Next, these substrates were conveyed to a hot zone of the quartz furnace kept at 600° C. in an oxygen atmosphere at a rate of 2000 mm/min, and conveyance was completed in 1 minute and 20 seconds. After the furnace temperature was stabilized at 600° C., the temperature was kept constant for 5 minutes, and the furnace temperature was then raised to 1000° C. After the furnace temperature was stabilized at 1000° C., the temperature was kept as it is for 180 minutes, whereby a silicon oxide film having a thickness of about 100 nm was formed on the substrate surfaces. Changes in the substrate temperature during this period were measured with the monitor substrate on which the thermocouple was installed, which revealed that $t_{emb.}$ was 9 minutes and 20 seconds.

Then, the oxide film on one surface of each substrate was removed by an aqueous hydrofluoric acid solution, and boron was diffused over the surface from which the oxide film was removed in the same manner as in Comparative Example 1. The subsequent processes were performed in the same manner as in Comparative Example 1, whereby solar cells were fabricated. The characteristics of these solar cells were measured by using pseudo sunlight of the Xe lamp light source. The measurement results are shown in Table 3. Each numerical value shown in Table 3 is the average value of the 100 substrates.

As shown in Table 3, the characteristics of the solar cells of Example 3 were better than the characteristics of the solar cells of Comparative Example 3.

Moreover, for 10 solar cells of each of Examples 1 to 3 and Comparative Examples 1 to 3, the interstitial oxygen concentration was measured. Table 4 shows the averaged $\Delta O_i$ (obtained by rounding off the number to one decimal place), which is difference between the initial interstitial oxygen concentration of the substrate measured in advance and the residual interstitial oxygen concentration after the fabrication of the solar cell, of the 10 samples. This reveals that, in Comparative Examples 1 to 3, the initial interstitial oxygen concentration decreases significantly ($\Delta O_i$ is large) and, in response to the swirls observed in FIG. 6(b) and FIG. 7(b), a relatively large amount of oxygen precipitates are formed.

TABLE 4

|  | $\Delta O_i$ [ppma] |
|---|---|
| Example 1 | 0.9 |
| Example 2 | 0.2 |
| Example 3 | 1.3 |
| Comparative Example 1 | 7.4 |
| Comparative Example 2 | 5.5 |
| Comparative Example 3 | 8.2 |

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a solar cell, which produces a single-crystal silicon solar cell by using a single-crystal silicon substrate, the method comprising:
a high-temperature heat treatment process in which the single-crystal silicon substrate is subjected to heat treatment at 800° C. or higher and 1200° C. or lower in a quartz furnace, wherein
the single-crystal silicon substrate that is used in production of the solar cell is a single-crystal silicon substrate whose initial interstitial oxygen concentration is 12 ppma (JEIDA) or more,
the high-temperature heat treatment process comprises:
a conveying step of loading the single-crystal silicon substrate into a heat treatment apparatus,
a heating step of heating the single-crystal silicon substrate,
a temperature keeping step of keeping the single-crystal silicon substrate at a predetermined temperature of 800° C. or higher and 1200° C. or lower, and
a cooling step of cooling the single-crystal silicon substrate, and in the high-temperature heat treatment process, a length of time during which a temperature of the single-crystal silicon substrate is 400° C. or higher and 650° C. or lower is set at 5 minutes or less throughout the conveying step and the heating step, and the high-temperature heat treatment process is performed by a batch process.

2. The method for producing a solar cell according to claim 1, wherein
in a first high-temperature heat treatment process in a production of the solar cell from the single-crystal silicon substrate, the length of time during which the temperature of the single-crystal silicon substrate is 400° C. or higher and 650° C. or lower is set at 5 minutes or less.

3. The method for producing a solar cell according to claim 2, wherein
the high-temperature heat treatment process is performed in an atmosphere containing an inert gas.

4. The method for producing a solar cell according to claim 3, wherein
the inert gas is nitrogen or argon.

5. The method for producing a solar cell according to claim 2, wherein the high-temperature heat treatment process is performed in an atmosphere containing oxygen or water.

6. The method for producing a solar cell according to claim 1, wherein
the high-temperature heat treatment process is performed in an atmosphere containing an inert gas.

7. The method for producing a solar cell according to claim 6, wherein
the inert gas is nitrogen or argon.

8. The method for producing a solar cell according to claim 1, wherein
the high-temperature heat treatment process is performed in an atmosphere containing oxygen or water.

9. The method for producing a solar cell according to claim 1, wherein
in the conveying step, the single-crystal silicon substrate is placed in a hot zone of the heat treatment apparatus in 10 minutes or less.

10. The method for producing a solar cell according to claim 1, wherein
the single-crystal silicon substrate is a CZ single-crystal silicon substrate.

11. The method for producing a solar cell according to claim 1, wherein
an amount of oxygen precipitates contained in the single-crystal silicon substrate after production of the solar cell is set at 2 ppma (JEIDA) or less.

12. A solar cell produced by the method for producing a solar cell according to claim 1, wherein
the solar cell has no swirls in electroluminescence or photoluminescence of the single-crystal silicon substrate in the single-crystal silicon solar cell.

13. A photovoltaic module comprising the solar cells according to claim 12 electrically connected to each other.

14. A photovoltaic power generation system comprising a plurality of the photovoltaic modules according to claim 13 electrically connected to each other.

15. A single-crystal silicon solar cell comprising a CZ single-crystal silicon substrate, wherein
an amount of oxygen precipitates contained in the CZ single-crystal silicon substrate is 2 ppma (JEIDA) or less,
a residual interstitial oxygen concentration contained in the CZ single-crystal silicon substrate is 10 ppma (JEIDA) or more, and
the solar cell has no swirls in electroluminescence or photoluminescence when light with a wavelength of 700 to 900 nm is applied as an excitation light source of the CZ single-crystal silicon substrate in the single-crystal silicon solar cell.

16. A photovoltaic module comprising the solar cells according to claim 15 electrically connected to each other.

17. A photovoltaic power generation system comprising a plurality of the photovoltaic modules according to claim 16 electrically connected to each other.

* * * * *